(12) United States Patent
Kim et al.

(10) Patent No.: US 7,348,073 B2
(45) Date of Patent: *Mar. 25, 2008

(54) SPIROCYCLOPENTAPHENANTHRENE-FLUORENE-BASED COMPOUND AND ORGANOELECTROLUMINESCENT DEVICE USING THE SAME

(75) Inventors: Kyu-Sik Kim, Suwon-si (KR); Woon-Jung Paek, Yongin-si (KR); Lyong-Sun Pu, Suwon-si (KR); In-Sung Song, Yongin-si (KR); Jong-Seob Kim, Suwon-si (KR); Ouck Han, Daejeon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 345 days.

This patent is subject to a terminal disclaimer.

(21) Appl. No.: 11/033,887

(22) Filed: Jan. 13, 2005

(65) Prior Publication Data

US 2005/0158583 A1    Jul. 21, 2005

(30) Foreign Application Priority Data

Jan. 15, 2004    (KR) ................ 10-2004-0002928

(51) Int. Cl.
| | |
|---|---|
| *H01L 51/54* | (2006.01) |
| *C09K 11/06* | (2006.01) |
| *C08G 61/00* | (2006.01) |
| *C07C 13/72* | (2006.01) |
| *C07F 7/08* | (2006.01) |

(52) U.S. Cl. ............. 428/690; 428/917; 313/504; 313/506; 257/40; 257/E51.026; 257/E51.027; 257/E51.028; 257/E51.029; 257/E51.032; 257/E51.033; 257/E51.036; 257/E51.046; 257/E51.049; 528/10; 528/25; 528/40; 528/380; 528/397; 528/417; 556/406; 556/431; 585/26

(58) Field of Classification Search ............ None
See application file for complete search history.

(56) References Cited

U.S. PATENT DOCUMENTS

| | | |
|---|---|---|
| 5,621,131 A | 4/1997 | Kreuder et al. |
| 5,763,636 A | 6/1998 | Kreuder et al. |
| 5,859,211 A | 1/1999 | Kreuder et al. |
| 5,900,327 A | 5/1999 | Pei et al. |
| 2005/0106418 A1* | 5/2005 | Kim et al. ............ 428/690 |
| 2006/0094859 A1* | 5/2006 | Marrocco et al. ........ 528/394 |

* cited by examiner

*Primary Examiner*—Milton I. Cano
*Assistant Examiner*—Brett A Crouse
(74) *Attorney, Agent, or Firm*—Robert E. Bushness, Esq.

(57) ABSTRACT

A spiro-based compound containing cyclopentaphenanthrene and fluorene, which is used for an organoelectroluminescent device and an organoelectroluminescent device having the spiro-based compound. The spiro-based compound containing cyclopentaphenanthrene and fluorene can be easily manufactured to have high solubility, high color purity, and good thermal stability. The spiro-based compound containing cyclopentaphenanthrene and fluorene is suitable as a substance for an organic film, in particular, an emission layer of an organoelectroluminescent device. Further, the spiro-based compound containing cyclopentaphenanthrene and fluorene can be used as an organic dye, or an electron material such as a non-linear optical material.

20 Claims, No Drawings

SPIROCYCLOPENTAPHENANTHRENE-FLUORENE-BASED COMPOUND AND ORGANOELECTROLUMINESCENT DEVICE USING THE SAME

CLAIM OF PRIORITY

This application claims the benefit of Korean Patent Application No. 2004-2928, filed on Jan. 15, 2004, in the Korean Intellectual Property Office, the disclosure of which is incorporated herein in its entirety by reference.

BACKGROUND OF INVENTION

1. Field of the Invention

The present invention relates to a spirocyclopentaphenanthrenefluorene-based compound and an organoelectroluminescent device using the same, and more particularly, to a spirocyclopentaphenanthrenefluorene-based compound with blue light-emitting characteristics, and an organoelectroluminescent device including an organic film containing the same to increase the purity of color and luminous efficiency.

2. Description of the Related Art

Cambridge University has developed an organoelectroluminescent device using a polyphenylenevinylene (PPV) film. The PPV film, which is a conjugated polymer, is prepared by wet-coating PPV. After the PPV-based conjugated polymer was disclosed, Covion Co. developed a novel PPV-type polymer, which is soluble in an organic solvent and has good chemical stability and luminous efficiency. Dow Chemical Co. has developed an emission layer-forming material polyfluorene-based compound, which performs better than the PPV-type polymer. The polyfluorene-based compound has been regarded as a blue light-emitting polymer. However, color purity of the polyfluorene-based compound has not met a desired level due to an excimer, which is generated on the side chains of a polyfluorene structure (U.S. Pat. No. 5,900,327 entitled Polyfluorenes as materials for photoluminescence and electroluminescence to Pei, et al., and issued on May 4, 1999). Therefore, there is a need to develop a polyfluorene-based compound with high color purity.

In order to increase color purity characteristics of the polyfluorene, U.S. Pat. No. 5,621,131 entitled Conjugated polymers having spiro centers and their use as electroluminescence materials to Kreuder, et al. and issued on Apr. 15, 1997 disclosed a luminescent material containing polyspirofluorenes, and U.S. Pat. No. 5,763,636 entitled Polymers containing spiro atoms and methods of using the same as electroluminescence materials to Kreuder, et al. and issued on Jun. 9, 1998 and U.S. Pat. No. 5,859,211 entitled Conjugated polymers containing heterospiro atoms and their use as electroluminescence materials to Kreuder, et al. and issued on Jan. 12, 1999 disclosed luminescent materials having a spirobifluorene, or a spirofluorene containing a heteroatom.

However, organoelectroluminescent devices using luminescent materials developed up to now have not met a desired level in terms of efficiency, color purity, and lifetime characteristics.

SUMMARY OF THE INVENTION

It is therefore an object of the present invention to provide a novel compound for an organic film for organoelectroluminescent devices.

It is also an object of the present invention to provide an improved organoelectroluminescent device.

It is further an object of the present invention to provide a spirocyclopentaphenanthrenefluorene compound, which is a novel blue light-emitting material.

It is another object of the present invention to provide an organoelectroluminescent device including an organic film containing the spirocyclopentaphenanthrenefluorene compound to increase luminous efficiency, thermal stability, color purity, and lifetime characteristics.

According to an aspect of the present invention, there is provided a spirocyclopentaphenanthrenefluorene-based compound represented by Formula 1:

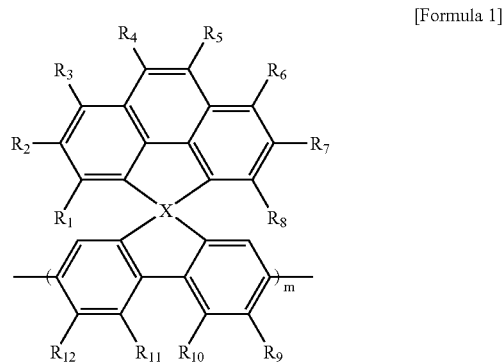

[Formula 1]

where X is C, S, or Si;

each of $R_1$, $R_2$, $R_3$, $R_4$, $R_5$, $R_6$, $R_7$, $R_8$, $R_9$, $R_{10}$, $R_{11}$, and $R_{12}$ is independently selected from H, a hydroxyl group, a substituted or unsubstituted amino group, a cyano group, a halogen atom, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, a substituted or unsubstituted C6-C30 arylalkyl group, and a substituted or unsubstituted C2-C30 heteroaryl group, wherein at least two adjacent substituents selected from $R_1$, $R_2$, $R_3$, $R_4$, $R_5$, $R_6$, $R_7$, and $R_8$ and at least one of $R_9$, $R_{10}$, $R_{11}$ and $R_{12}$ are connected to one another to form a saturated or unsaturated ring; and m is an integer ranging from 2 to 5,000.

The present invention also provides an organoelectroluminescent device including an organic layer interposed between a pair of electrodes, wherein the organic layer contains the spirocyclopentaphenanthrenefluorene-based compound.

DETAILED DESCRIPTION OF THE PREFERRED EMBODIMENTS

The present invention provides a spirocyclopentaphenanthrenefluorene-based compound represented by Formula 1, and more particularly, a spirocyclopentaphenanthrenefluorene-based compound further containing an arylene (Ar) repeat unit represented by Formula 2. In Formula 2, n is a mixture ratio of a spirocyclopentaphenanthrenefluorene-based compound repeat unit to the total polymer, and 1-n is a mixture ratio of the Ar repeat unit to the total polymer.

[Formula 2]

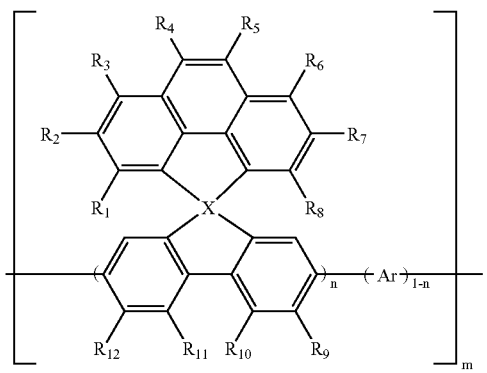

where Ar is a substituted or unsubstituted C6-C30 arylene group, a substituted or unsubstituted C2-C30 heteroarylene group, or a substituted or unsubstituted C2-C30 heterocycle group; $R_1$, $R_2$, $R_3$, $R_4$, $R_5$, $R_6$, $R_7$, $R_8$, $R_9$, $R_{10}$, $R_{11}$, and $R_{12}$ are as above described in Formula 1; m is a real number ranging from 2 to 5,000; and n is a real number ranging from 0.01 to 1.0.

In Formula 2, n is a real number ranging from 0.01 to 1.0, and preferably ranging from 0.5 to 1.0. At least two adjacent substitutents selected from $R_1$, $R_2$, $R_3$, $R_4$, $R_5$, $R_6$, $R_7$, and $R_8$ and at least one of $R_9$, $R_{10}$, $R_{11}$ and $R_{12}$ are connected to one another to form a substituted and unsubstituted C3-C50 ring. In this case, the ring may contain a hetero atom such as N, O, S, or the like.

In Formulas 1 and 2, a substituent substituted to each of the alkyl group, the cycloalkyl group, the alkoxy group, the aryl group, the arylalkyl group, the heteroaryl group, the amino group and /or the heterocycle group is independently a C1-C12 alkyl group; C1-C12 alkoxy group; a halogen atom such as F and Cl; a C1-C12 alkylamino group; a hydroxy group; a nitro group; a cyano group; a substituted or unsubstituted amino group such as —NH$_2$, —NH(R), or —N(R')(R'') where each of R' and R'' is independently a C1-C12 alkyl group; a carboxyl group; a sulfonic acid; a phosphoric acid; a C1-C12 halogenated alkyl group; a C2-C12 alkenyl group; a C2-C12 alkynyl group; a C2-C12 heteroalkyl group; a C6-C30 aryl group; a C6-C30 arylalkyl group; a C2-C30 heteroaryl group; or a C2-C30 heteroarylalkyl group.

The Ar unit in Formula 2 has one of the structures represented by Formulae 3a through 3t, and preferably a phenoxazine structure.

3a
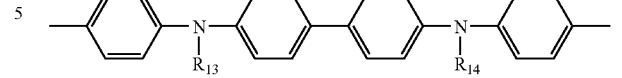

3b
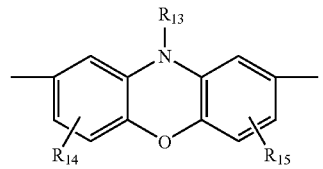

3c
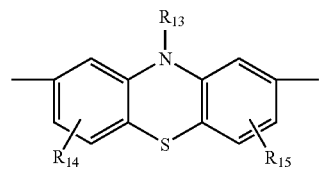

3d
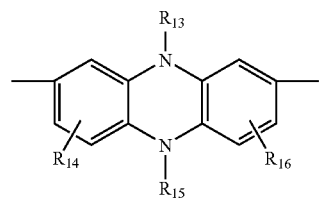

3e
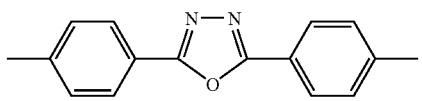

3f
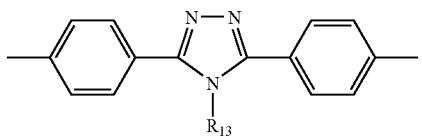

3g
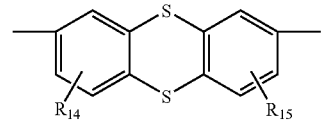

3h
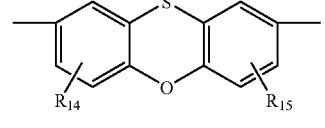

3i
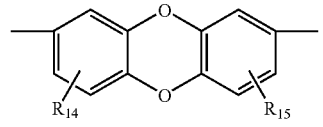

3j

3k

3l
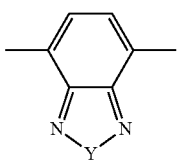

-continued

3m 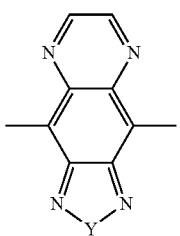

3n 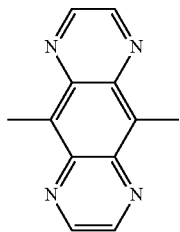

3o 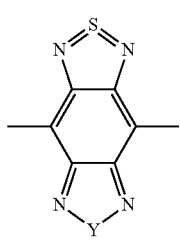

3p 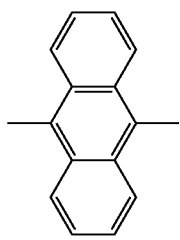

3q 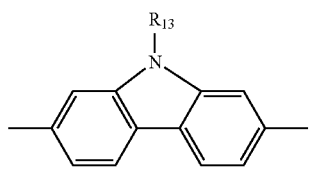

3r 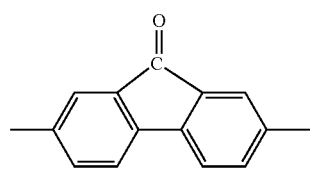

3s 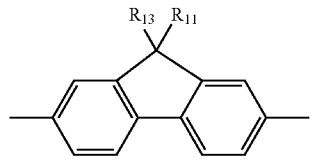

-continued

3t 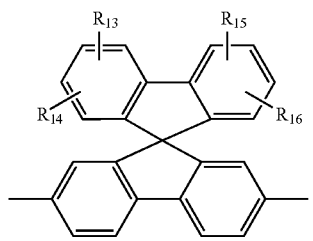

where Y is O or S; and each of $R_{13}$, $R_{14}$, $R_{15}$ and $R_{16}$ is independently selected from H, a hydroxyl group, a substituted or unsubstituted amino group, a cyano group, a halogen atom, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, and a substituted or unsubstituted C2-C30 heteroaryl group.

The spirocyclopentaphenanthrenefluorene-based compound represented by Formula 1, for instance, may be, a compound represented by Formula 4.

[Formula 4]

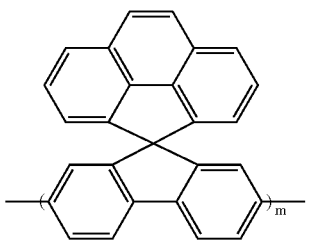

where m is a real number ranging from 2 to 5000.

The compound represented by Formula 2, for instance, may be a compound represented by Formula 5.

[Formula 5]

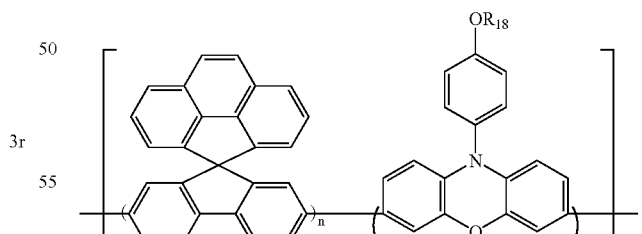

where $R_{18}$ is a C1-C12 alkyl group; n is a real number ranging from 0.01 to 0.99; and m is a real number ranging from 2 to 5,000.

An exemplary embodiment of the compound represented by Formula 5 is a compound represented by Formula 6.

[Formula 6]

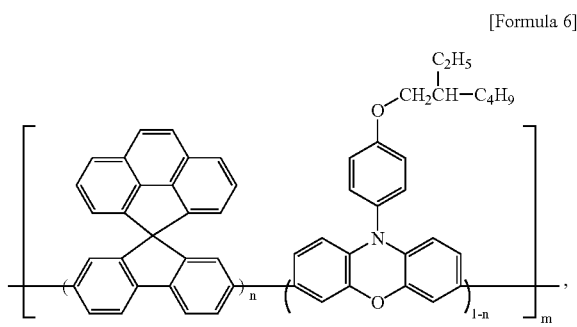

where n is a real number ranging from 0.01 to 0.99, and m is a real number ranging from 2 to 5,000.

The spirocyclopentaphenanthrenefluorene-based compound according to the present invention can be obtained by polymerizing a monomer containing a spirocyclopentaphenanthrenefluorene-based compound. Alternately, the novel spirocyclopentaphenanthrenefluorene-based compound is copolymerized with an Ar monomer containing halide to produce the spirocyclopentaphenanthrenefluorene-based compound according to the present invention. As described above, the compound can be easily manufactured. Further, the compound has high solubility, good color stability, and strong thermal stability. As a result, the compound can be used to form an organic film of an organoelectroluminescent device.

The spirocyclopentaphenanthrenefluorene-based compound containing the repeat unit represented by Formula 1 may have a degree of polymerization of the repeat unit of 15 or greater, preferably in the range of 15 to 200. In this case, a number-average molecular weight of the polymer may be greater than 10,000, preferably in the range of 10,000 to 200,000, and more preferably, in the range of 10,000 to 100,000. When the number average molecular weight of the polymer remains inside of the range, the polymer, for instance, may have excellent film forming characteristics.

An organoelectroluminescent device according to the present invention is manufactured using an organic film, in particular, an emission layer containing the spirocyclopentaphenanthrenefluorene-based compound represented by Formula 1. In this case, the spirocyclopentaphenanthrenefluorene-based compound represented by Formula 1 can be used as an emission layer forming material, in particular, as a blue light-emitting material. Additionally, the compound can be used to form an organic film, such as a hole transport layer and an electron transport layer.

The spirocyclopentaphenanthrenefluorene-based compound represented by Formula 1 can be used in isolation to form an emission layer, and may be used with a common dopant to form an emission layer. If the compound is used with a common dopant, the amount of the spirocyclopentaphenanthrenefluorene-based compound represented by Formula 1 may be in the range of 30 to 80 parts by weight based on 100 parts by weight of the total weight of an emission layer forming material. An emission layer containing the sirocyclopentaphenanthrenefluorene-based compound may be formed, for instance, using vacuum deposition, sputtering, printing, coating, ink-jet printing, or a method using an electron beam.

The organic film may have a thickness of 50 to 100 nm. The organic film may include, besides the emission layer, a film composed of an organic compound, such as an electron transport layer and a hole transport layer.

The organoelectroluminescent device may have a conventional structure, including an anode/emission layer/cathode structure, an anode/butter layer/emission layer/cathode structure, an anode/a hole transport layer/an emission layer/cathode structure, an anode/buffer layer/hole transport layer/emission layer/cathode structure, an anode/butter layer/hole transport layer/emission layer/electron transport layer/cathode structure, and an anode/butter layer/hole transport layer/emission layer/hole blocking layer/cathode structure, but is not limited thereto.

Any material that is commonly used to form a buffer layer can be used in the present invention. Preferably, the buffer layer may be formed using Poly(3,4-ethylenedioxythiophene) poly(styrenesulfonate) (PEDOT/PSS), copper phthalocyanine, polythiophene, polyaniline, polyacetylene, polypyrrole, polyphenylene vinylene, or a derivative of these, but is not limited thereto.

Any material that is commonly used to form a hole transport layer can be used in the present invention. The hole transport layer may be polytriphenylamine, but is not limited thereto.

Any material that is commonly used to form an electron transport layer can be used in the present invention. The electron transport layer may be polyoxadiazole, but is not limited thereto.

Any material that is commonly used to form a hole blocking layer can be used in the present invention. The hole blocking layer may be LiF, $BaF_2$, or $MgF_2$, but is not limited thereto.

The organoelectroluminescent device can be manufactured in a method using a common light-emitting material without specific apparatus and methods.

Hereinafter, the present invention will be further described with reference to the following examples. The following examples are for illustrative purposes and are not intended to limit the scope of the present invention.

PREPARATION EXAMPLE 1

Manufacture of 2,7-dibromofluorene-4on 0.3 g of $CrO_3$ was added to 18.9 g (58.32 mmol) of 2,7-dibromonfluorene dissolved in 97 mL of t-butylhydroperoxide (70 wt % in water), and stirred at room temperature for 12 hours.

After the reaction was completed, the reaction mixture was extracted using 300 mL of methylenechloride. The organic layer obtained by extraction was washed with water, dried, and then concentrated to attain yellow solids. Ethyl acetate was added to the yellow solids to re-crystallize to produce 16.3 g of the object material (82.6%).

$^1$H-NMR(CDCl$_3$): ppm 7.35, 7.38 (2H, d), 7.60, 7.606 (2H, d, J=1.8 Hz), 7.62, 7.63 (2H, d, J=1.83 Hz), 7.744, 7.749 (2H, d, J=1.65 Hz)

PREPARATION EXAMPLE 2

Manufacture of 4-(4H-cyclopenta[def]phenanthrenyl)-2,7-dibromo-4-spirofluorene 2-bromophenanthrene (ref: synthetic communication, 9(5), 377(1979), 20 g, 77.8 mmol) was dissolved in 300 mL of an anhydrous THF, and then cooled to −78° C. 62.4 mL of 2.5M normal butyllitium (156 mmol) was added thereto, and then stirred for 30 minutes under a cold environment.

24.67 g (73 mmol) of 2,7-dibromofluorene-4-one dissolved in 500 mL of an anhydrous THF was slowly added to the resultant mixture, and then stirred for 30 minutes while cooling.

After the reaction was quenched using water, the resultant mixture was extracted using ethyl acetate, dried, filtered, and concentrated. The result was refined using the column chromatography using a solvent mixture of ethylacetate and hexane in a volume ratio of 1:8 to attain 4-(phenanthrenyl)-2,7-dibromofluorene-4-ol.

12.3 g (22.86 mmol) of 4-(phenanthrenyl)-2,7-dibromofluorene-4-ol was dissolved in 120 mL of acetic acid, added with 5 drops of concentrated HCl, and then refluxed for 2 hours.

After the reaction was completed, the resultant mixture was extracted using ethyl acetate, washed, dried, refluxed, and then concentrated. Then, the concentrated product was separated using the column (solvent: hexane) to attain 5.7 g of the objective material (yield: 47.97%).

$^1$H-NMR(CDCl$_3$): ppm 6.47, 6.85, 6.90 (4H, 2m), 7.14, 7.26 (4H, 2m), 7.51(4H, m), 7.69, 7.78, 7.98 (2H, 3m)

MASS (m/z): 500(M+2), 419, 339, 263, 207, 169

PREPARATION EXAMPLE 3

Manufacture of poly(spirocyclopentaphenanthrenefluorene)

Moisture inside a Schlenk flask was completely removed using a vacuum and nitrogen substitution. 0.444 g (1.614 mmol) of bis(1,5-cyclooctadiene)nickel(O) and 0.252 g (1.614 mmol) of 2,2'-bipyridinewere were injected into the Schlenk flask inside a glove box, and then the inside of the Schlenk flask was substituted with a vacuum and nitrogen.

Then, 8 ml of anhydrous dimethylformamide(DMF), 0.2 ml of 1,5-cyclooxtadiene (COD), and 8 ml of an anhydrous toluene were added thereto under a nitrogen atmosphere, and then stirred at 70° C. for 30 minutes. Then, a diluted solution of 0.402 g (0.807 mmol) of 4-(4H-cyclopenta[def]phenanthrenyl)-2,7-dibromo-4-spirofluorene, prepared in Preparation Example 2 in 8 ml of toluene was added to the mixture. The reaction mixture was refluxed at 70° C. for 24 hours, and then cooled to room temperature.

The reaction mixture was treated using an acid solution including HCl, acetone, and methanol in a volume ratio of 1:1:2 to produce precipitates. The obtained precipitates were refined using toluene and methanol, and then treated using a soxhlet extractor (yield: 70%). The molecular weight of the resulting polymer was measured using gel permeation chromatography (GPC). The number-average molecular weight (Mn) was about 75,000.

PREPARATION EXAMPLE 4

Manufacture of poly(spirocyclopentaphenanthrenefluorene-CO-phenoxazine (Mole Ratio of 95:5)
(Refer to Reaction Scheme 1)

[Reaction Scheme 1]

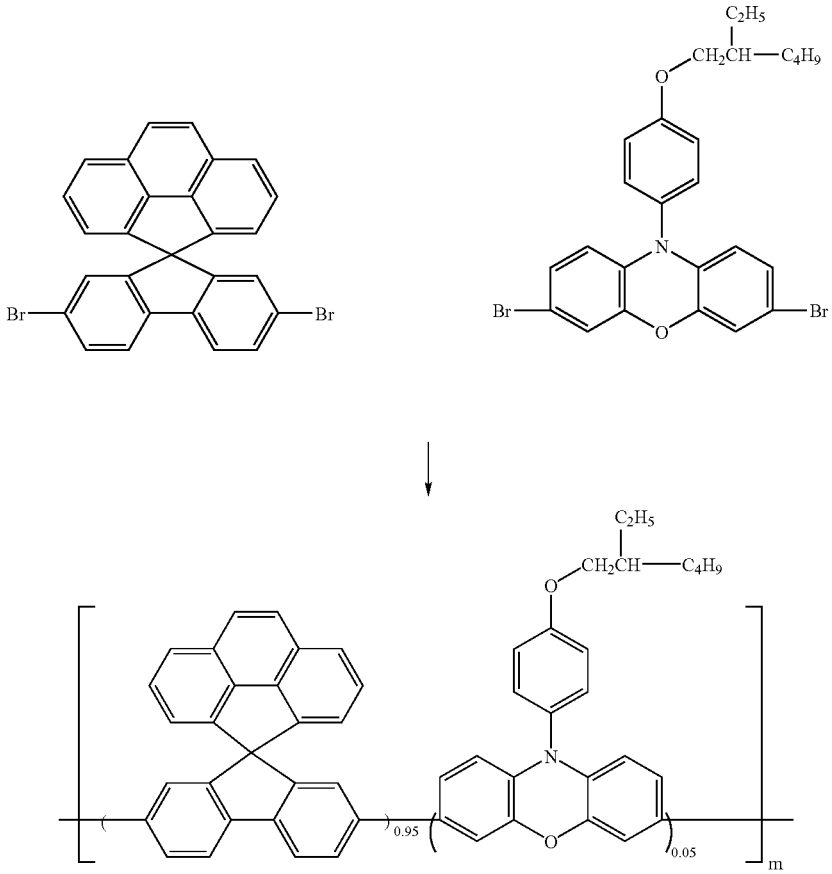

Moisture inside a Schlenk flask was completely removed using a vacuum and nitrogen substitution. 0.465 g (1.690 mmol) of bis(1,5-cyclooctadiene)nickel(O) and 0.264 g (1.690 mmol) of 2,2'-bipyridinewere injected into the Schlenk flask in a glove box, and then the inside of the Schlenk flask was substituted with vacuum and nitrogen.

Then, 4 ml of anhydrous dimethylformamide(DMF), 0.2 ml of 1,5-cyclooxtadiene (COD), and 8 ml of an anhydrous toluene were added thereto under a nitrogen atmosphere, and then stirred at 70° C. for 30 minutes. Then, a diluted solution of 0.400 g (0.803 mmol) of 4-(4H-cyclopenta[def]phenanthrenyl )-2,7-dibromo-4-spirofluorene, prepared in Preparation Example 2 and 0.023 g (0.042 mmol) of 3,7-dibromo-10-[4-(2-ethyl-hexyloxy)-phenyl]-10,10a-dihydro-4H-phenoxazine in 8 ml of toluene was added to the mixture. The reaction mixture was refluxed at 70° C. for 24 hours, and then cooled to room temperature.

The reaction mixture was treated using an acid solution including HCl, acetone, and methanol in a volume ratio of 1:1:2 to produce precipitates. The obtained precipitates were refined using toluene and methanol, and then treated using a soxhiet extractor (yield: 65%). The molecular weight of the resulting polymer was measured using gel permeation chromatography (GPC). The number-average molecular weight (Mn) was about 78,000.

EXAMPLE 1

Manufacture of Organoelectroluminescent Device

Indium-tin oxide (ITO) was coated on a substrate to form a transparent electrode substrate with an ITO layer. The ITO layer was patterned in a desired form using a photoresist resin and an etchant, and cleaned using UV. Then, Batron P 4083 (obtained from Bayer Co.) was coated to about 80 nm thickness on the patterned ITO layer, to form a conductive buffer layer, and then baked at 180° C. for about 1 hour. Then, the polymer manufactured according to Preparation Example 4 was dissolved in toluene to prepare a polymer solution. The buffer layer was spin-coated using the polymer solution, and then baked to completely remove the solvent in a vacuum oven to form an emission layer. In this case, the polymer solution was filtered using a 0.2 mm filter before the spin coating. In addition, the concentration of the polymer solution and the spin speed were controlled to make the polymer film have a thickness of about 80 nm. Then, Ca and Al were sequentially deposited using vacuum deposition equipment on the emission layer while maintaining a vacuum at $4 \times 10^{-6}$ torr or less. In the deposition process, the thickness and growing rate of the films were controlled using a crystal sensor. An electroluminescent (EL) device manufactured in the above-mentioned manner had an ITO/PEDOT/light-emitting polymer/Ca/Al structure, and the light-emitting area was 4 mm².

A spirocyclopentaphenanthrenefluorene-based compound according to the present invention can be easily manufactured to have high solubility, high 11 color purity, good color stability, and good thermal stability. Therefore, the spirocyclopentaphenanthrenefluorene-based compound is suitable as a substance for an organic film, in particular, an emission layer of an oragnoelectroluminescent device. In addition, the compound can be used as an organic dye, or an electron material such as a non-linear optical material.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A spiro compound represented by Formula 2:

[Formula 2]

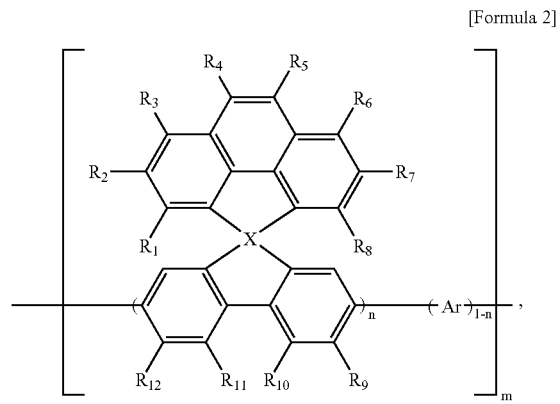

wherein X is C, S, or Si;

each of $R_1$, $R_2$, $R_3$, $R_4$, $R_5$, $R_6$, $R_7$, $R_8$, $R_9$, $R_{10}$, $R_{11}$, and $R_{12}$ is independently selected from the group consisting of H, a halogen atom, a hydroxy group, a substituted or unsubstituted amino group, a cyano group, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, a substituted or unsubstituted C6-C30 arylalkyl group, and a substituted or unsubstituted C2-C30 heteroaryl group;

at least two adjacent substituents selected from $R_1$, $R_2$, $R_3$, $R_4$, $R_5$, $R_6$, $R_7$, and $R_8$ and at least one of $R_9$, $R_{10}$, $R_{11}$ and $R_{12}$ are optionally connected to one another to form a saturated or unsaturated ring;

Ar is a substituted or unsubstituted C6-C30 arylene group, a substituted or unsubstituted C2-C30 heteroarylene group, or a substituted or unsubstituted C2-C30 heterocycle group;

m is an integer ranging from 2 to 5,000;

n is a real number ranging from 0.01 to 1.0.

2. The spiro compound of claim 1, wherein n is 1.0.

3. The spiro compound of claim 1, wherein the Ar has one of the structures represented by Formulae 3a through 3t:

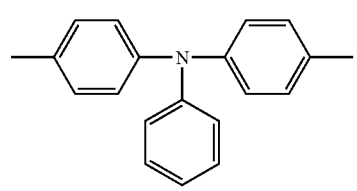

3a

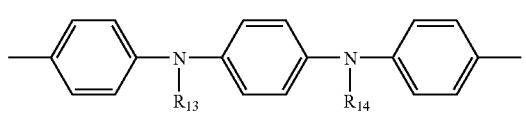

3b

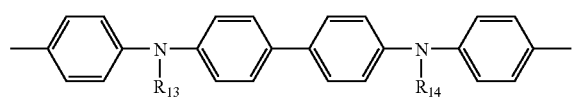

3c

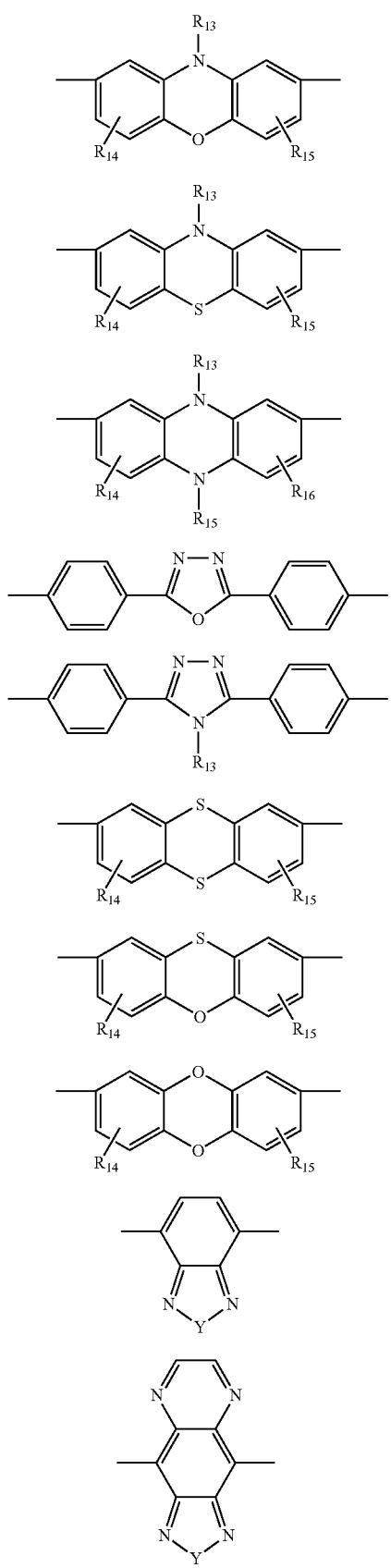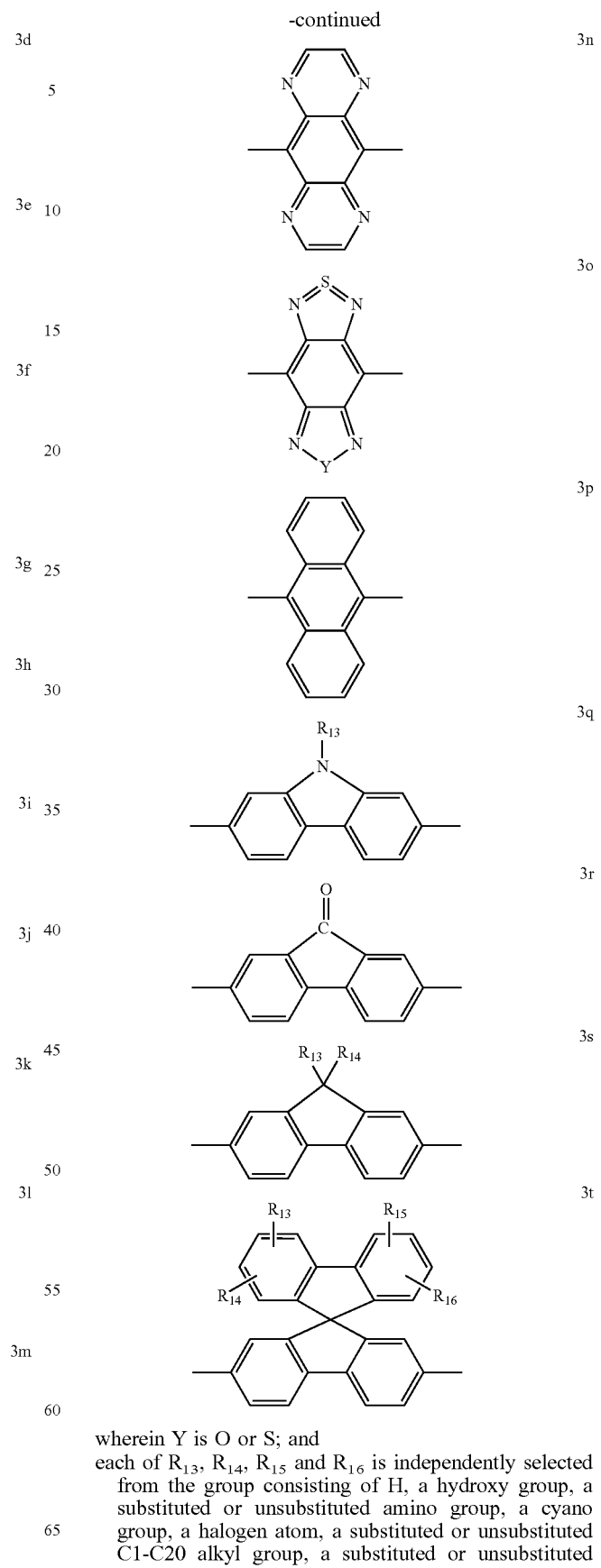
wherein Y is O or S; and
each of $R_{13}$, $R_{14}$, $R_{15}$ and $R_{16}$ is independently selected from the group consisting of H, a hydroxy group, a substituted or unsubstituted amino group, a cyano group, a halogen atom, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, and a substituted or unsubstituted C2-C30 heteroaryl group.

4. The spiro compound of claim 1, wherein the spiro compound is represented by Formula 4:

[Formula 4]

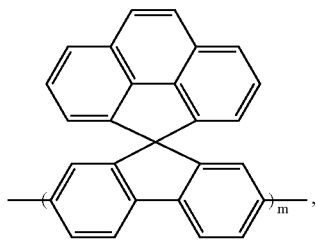

wherein m is an integer ranging from 2 to 5,000.

5. The spiro compound of claim 1, wherein the spiro compound is represented by Formula 5:

[Formula 5]

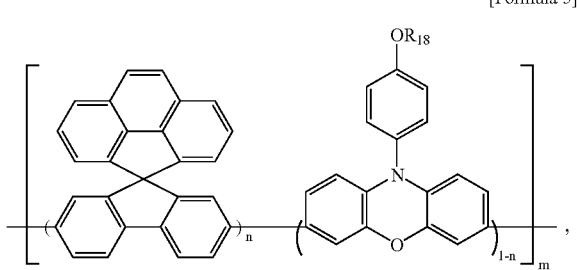

wherein $R_{18}$ is a C1-C12 alkyl group; n is a real number ranging from 0.01 to 0.99; and m is an integer ranging from 2 to 5,000.

6. The spiro compound of claim 5, wherein the spiro compound is represented by Formula 6:

[Formula 6]

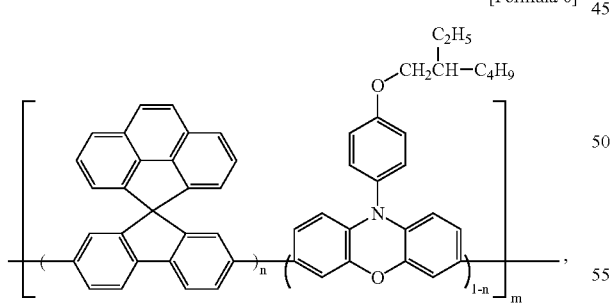

wherein n is a real number ranging from 0.01 to 0.99, and m is an integer ranging from 2 to 5,000.

7. An organoelectroluminescent device comprising an organic film having the spiro compound of claim 1 and being interposed between a pair of electrodes.

8. An organic dye comprising the spiro compound of claim 1.

9. A non-linear optical material comprising the spiro compound of claim 1.

10. An organoelectroluminescent device, comprising:
a pair of electrodes;
an organic film interposed between said pair of electrodes, the organic film comprising a spiro compound having a repeat unit represented by:

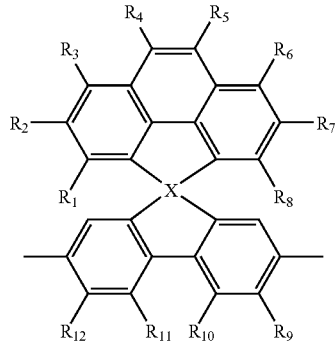

wherein X is C, S, or Si;
each of $R_1$, $R_2$, $R_3$, $R_4$, $R_5$, $R_6$, $R_7$, $R_8$, $R_9$, $R_{10}$, $R_{11}$, and $R_{12}$ is independently selected from the group consisting of H, a halogen atom, a hydroxy group, a substituted or unsubstituted amino group, a cyano group, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, a substituted or unsubstituted C6-C30 arylalkyl group, and a substituted or unsubstituted C2-C30 heteroaryl group, wherein at least two adjacent substituents selected from $R_1$, $R_2$, $R_3$, $R_4$, $R_5$, $R_6$, $R_7$, and $R_8$ and at least one of $R_9$, $R_{10}$, $R_{11}$ and $R_{12}$ are optionally connected to one another to form a saturated or unsaturated ring; and
the spiro compound has a polymerization degree ranging from 2 to 5,000.

11. The organoelectroluminescent device of claim 10, wherein the organic film is an emission layer, a hole transport layer, or an electron transport layer.

12. The organoelectroluminescent device of claim 10, wherein the organic film comprises a dopant as an emission layer.

13. The organoelectroluminescent device of claim 12, wherein an amount of the spiro compound is in the range of 30 to 80 parts by weight based on 100 parts by weight of the total weight of the emission layer.

14. The organoelectroluminescent device of claim 10, wherein the spiro compound further comprises an arylene (Ar) repeat unit and is represented by Formula 2:

[Formula 2]

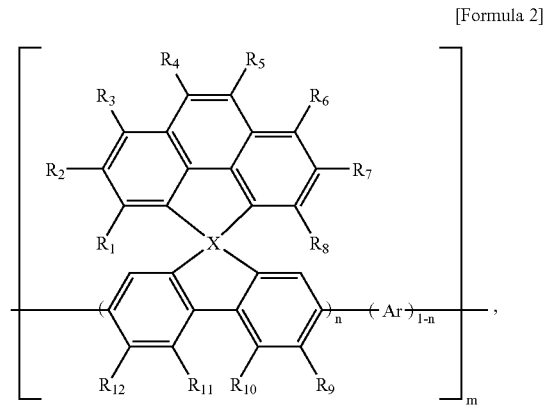

wherein Ar is a substituted or unsubstituted C6-C30 arylene group, a substituted or unsubstituted C2-C30 heteroarylene group, or a substituted or unsubstituted C2-C30 heterocycle group;

m is an integer ranging from 2 to 5,000; and n is a real number ranging from 0.01 to 1.0.

15. The organoelectroluminescent device of claim 14, wherein the Ar has one of the structures represented by Formulae 3a through 3t:

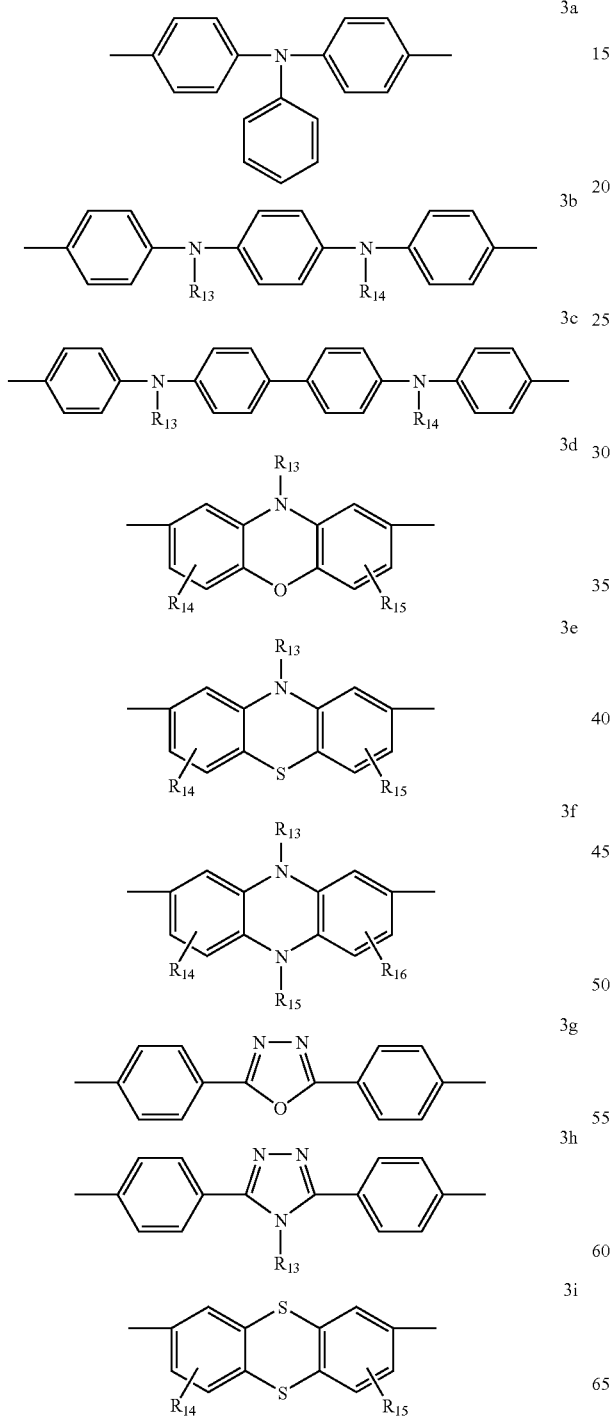
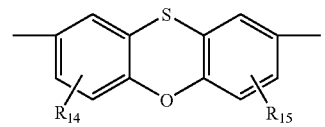
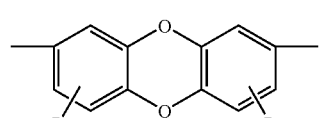
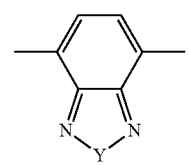
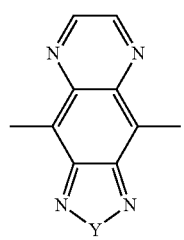
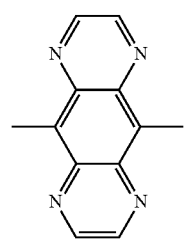
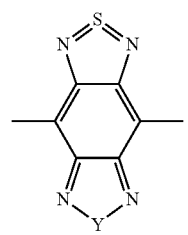
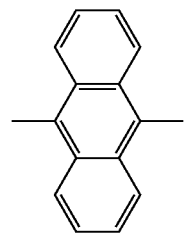
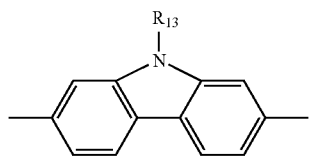

-continued

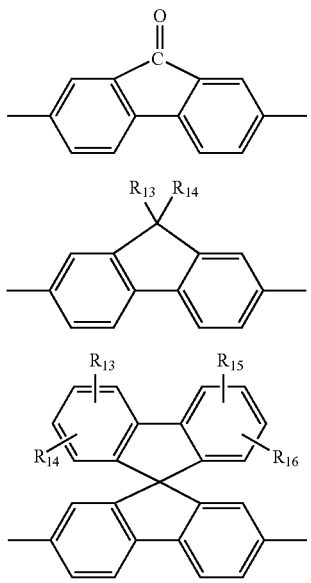

wherein Y is O or S; and each of $R_{13}$, $R_{14}$, $R_{15}$ and $R_{16}$ is independently selected from the group consisting of H, a hydroxy group, a substituted or unsubstituted amino group, a cyano group, a halogen atom, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, and a substituted or unsubstituted C2-C30 heteroaryl group.

16. The organoelectroluminescent device of claim 10, wherein the spiro compound is represented by Formula 4:

[Formula 4]

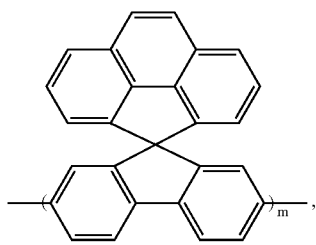

wherein m is an integer ranging from 2 to 5,000.

17. The organoelectroluminescent device of claim 14, wherein the spiro compound is represented by Formula 5:

[Formula 5]

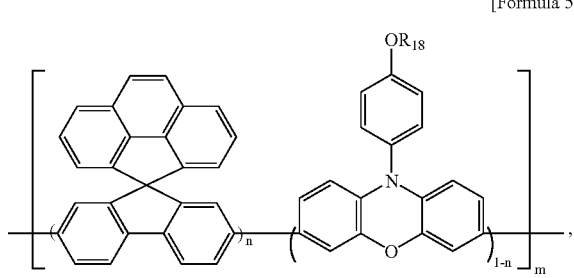

wherein $R_{18}$ is a C1-C12 alkyl group; n is a real number ranging from 0.01 to 0.99; and m is an integer ranging from 2 to 5,000.

18. The organoelectroluminescent device of claim 17, wherein the spiro compound is represented by Formula 6:

[Formula 6]

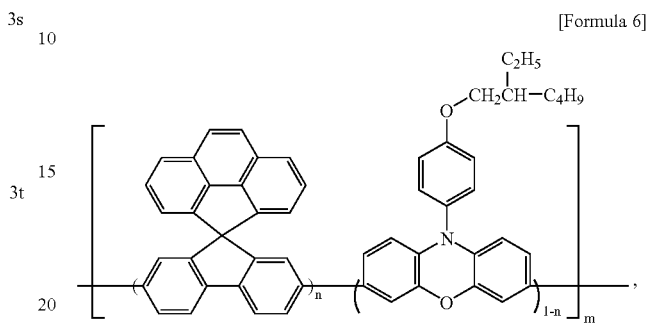

wherein n is a real number ranging from 0.01 to 0.99, and m is an integer ranging from 2 to 5,000.

19. The organoelectroluminescent device of claim 10, wherein a number-average molecular weight of the spiro compound is at least 10,000.

20. A spiro compound having a repeat unit represented by:

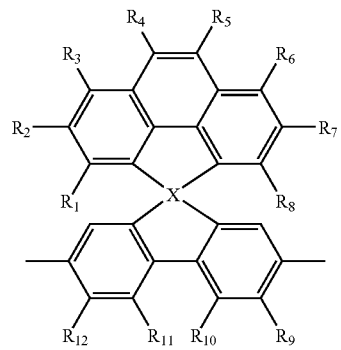

wherein X is C, S, or Si;

each of $R_1$, $R_2$, $R_3$, $R_4$, $R_5$, $R_6$, $R_7$, $R_8$, $R_9$, $R_{10}$, $R_{11}$, and $R_{12}$ is independently selected from the group consisting of H, a halogen atom, a hydroxy group, a substituted or unsubstituted amino group, a cyano group, a substituted or unsubstituted C1-C20 alkyl group, a substituted or unsubstituted C3-C20 cycloalkyl group, a substituted or unsubstituted C1-C20 alkoxy group, a substituted or unsubstituted C6-C30 aryl group, a substituted or unsubstituted C6-C30 arylalkyl group, and a substituted or unsubstituted C2-C30 heteroaryl group, wherein at least two adjacent substituents selected from $R_1$, $R_2$, $R_3$, $R_4$, $R_5$, $R_6$, $R_7$, and $R_8$ and at least one of $R_9$, $R_{10}$, $R_{11}$ and $R_{12}$ are optionally connected to one another to form a saturated or unsaturated ring; and the spiro compound has a polymerization degree of from 2 to 5,000.

* * * * *